US009806164B1

(12) United States Patent
Terrones et al.

(10) Patent No.: US 9,806,164 B1
(45) Date of Patent: Oct. 31, 2017

(54) CONTROLLED SYNTHESIS AND TRANSFER OF LARGE AREA HETEROSTRUCTURES MADE OF BILAYER AND MULTILAYER TRANSITION METAL DICHALOCOGENIDES

(71) Applicants: Humberto Terrones, State College, PA (US); Mauricio Terrones, State College, PA (US); Ana Laura Elias, State College, PA (US); Nestor Perea-Lopez, State College, PA (US)

(72) Inventors: Humberto Terrones, State College, PA (US); Mauricio Terrones, State College, PA (US); Ana Laura Elias, State College, PA (US); Nestor Perea-Lopez, State College, PA (US)

(73) Assignee: The Penn State Research Foundation, University Park, PA (US)

( * ) Notice: Subject to any disclaimer, the term of this patent is extended or adjusted under 35 U.S.C. 154(b) by 438 days.

(21) Appl. No.: 14/229,181

(22) Filed: Mar. 28, 2014

Related U.S. Application Data

(60) Provisional application No. 61/805,461, filed on Mar. 26, 2013.

(51) Int. Cl.
*H01L 29/45* (2006.01)
*H01L 29/417* (2006.01)
*H01L 21/285* (2006.01)

(52) U.S. Cl.
CPC ........ *H01L 29/45* (2013.01); *H01L 21/28556* (2013.01); *H01L 29/417* (2013.01)

(58) Field of Classification Search
None
See application file for complete search history.

(56) References Cited

U.S. PATENT DOCUMENTS

| | | | | |
|---|---|---|---|---|
| 4,822,590 A | * | 4/1989 | Morrison | C01B 17/20 106/DIG. 2 |
| 2005/0158909 A1 | * | 7/2005 | Milliron | C23C 18/1204 438/85 |

OTHER PUBLICATIONS

Ma et. al. Journal Phys. Chem. C2011, 115, 2011 20237-20241.*
K. Mak et al., "Atomically Thin MoS2: A New Direct-Gap Semiconductor", Physical Review Letters, (2010); 4 pages.
A. Elias et al, "Controlled Synthesis and Transfer of Large-Area WS2 Sheets: From Single Layer to Few Layers", ACS Nano, vol. 7, (2013); pp. 5235-5242.
H. Gutierrez et al., "Extraordinary Room-Temperature Photoluminescence in Triangular WS2 Monolayers", Nano Letters (2012); pp. 3447-.
H. Terrones et al., "Novel hetero-layered materials with tunable direct band gaps by sandwiching different metal disulfides and diselenides", Scientific Reports, (2013); pp. 1-7.

(Continued)

*Primary Examiner* — Vera Katz
(74) *Attorney, Agent, or Firm* — Buchanan Ingersoll & Rooney PC

(57) ABSTRACT

Embodiments are presented herein that provide a TMD system wherein the first layered material is made of heterobilayers or multilayers with semiconducting direct band gaps. The first layered material may be made of multiple layers of different TMD with different stackings, exhibiting smaller direct and indirect band gaps smaller than monolayer systems of TMD.

8 Claims, 14 Drawing Sheets

(56) References Cited

OTHER PUBLICATIONS

M. Terrones et al., "Light-Emitting Triangles May Have Applications in Optical Technology", PennState Science, (2013); 2 pages.
H. Zeng et al., "Valley polarization in MoS2 monolayers by optical pumping", Nature Nanotechnology, vol. 7, (2012); pp. 490-493.
G. Eda et al., "Photoluminescence from Chemically Exfoliated Mos2", NANO Letters, ACS Publications, (2011); pp. 5111-5116).
Louise S. Price et al, "Chemical Vapor Deposition", Chem. Vap. Deposition, 1998, 4, No. 6; pp. 222-225.

* cited by examiner

FIG. 1A
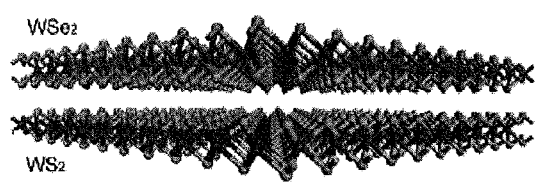
FIG. 1B
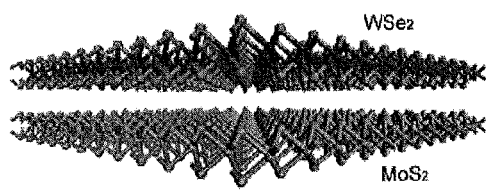
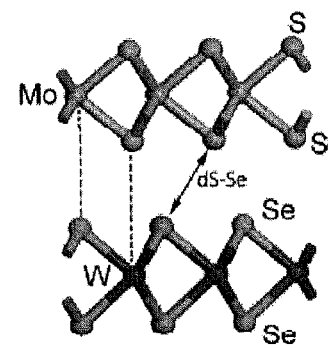
FIG. 1C
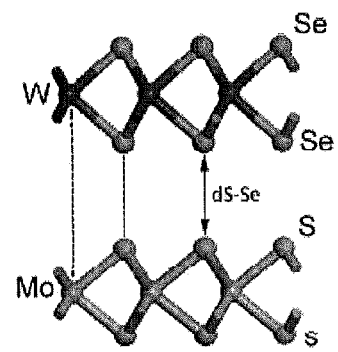
FIG. 1D

FIG. 2A
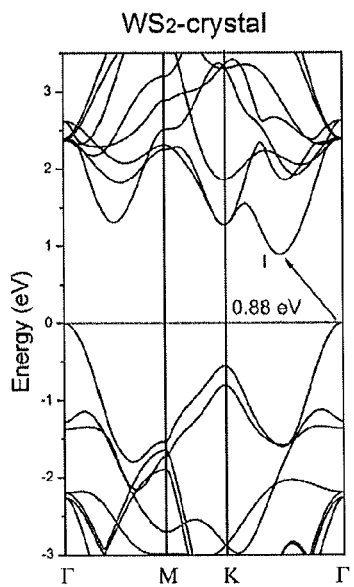
FIG. 2B
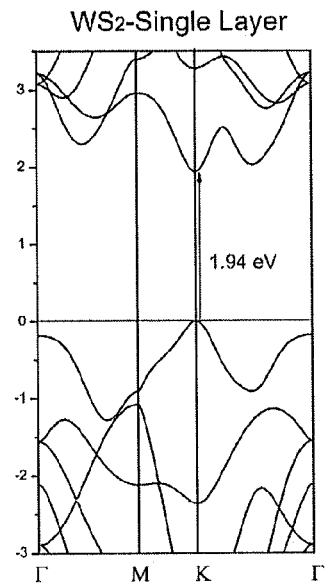
FIG. 2C
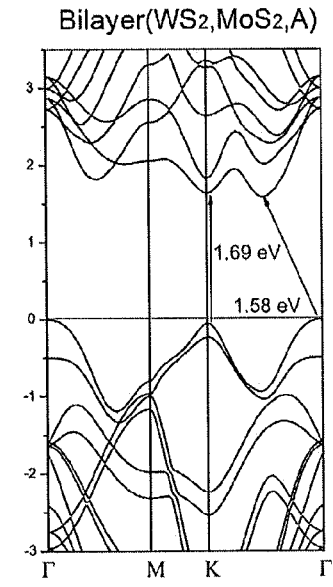
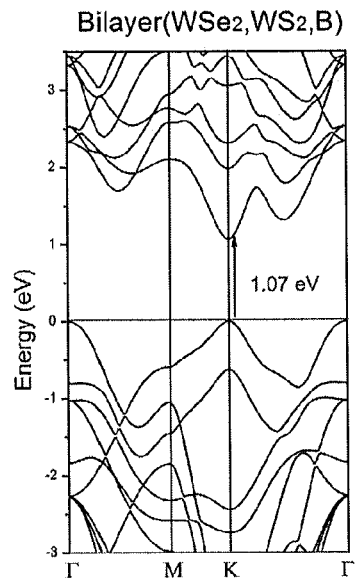
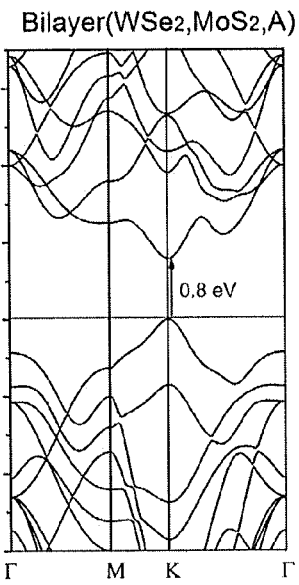
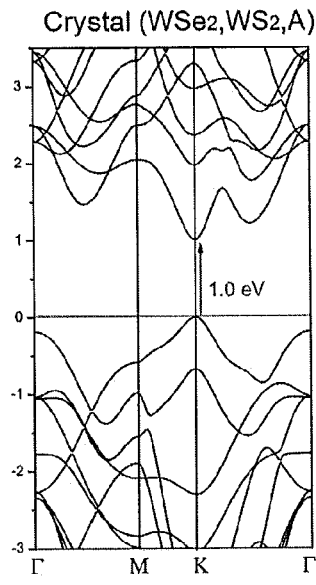
FIG. 2D
FIG. 2E
FIG. 2F FIG. 5A
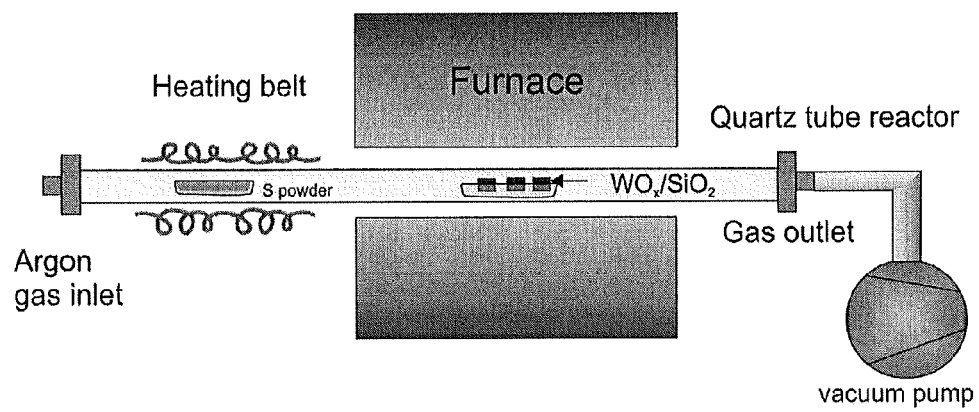
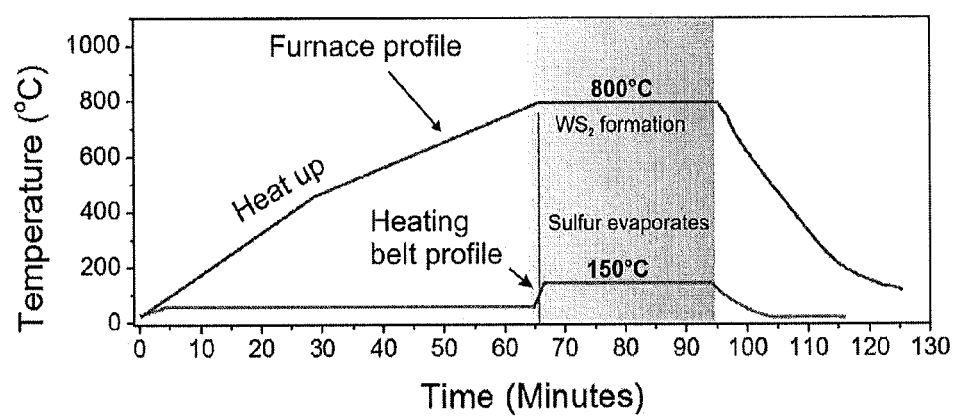
FIG. 5B FIG. 6A
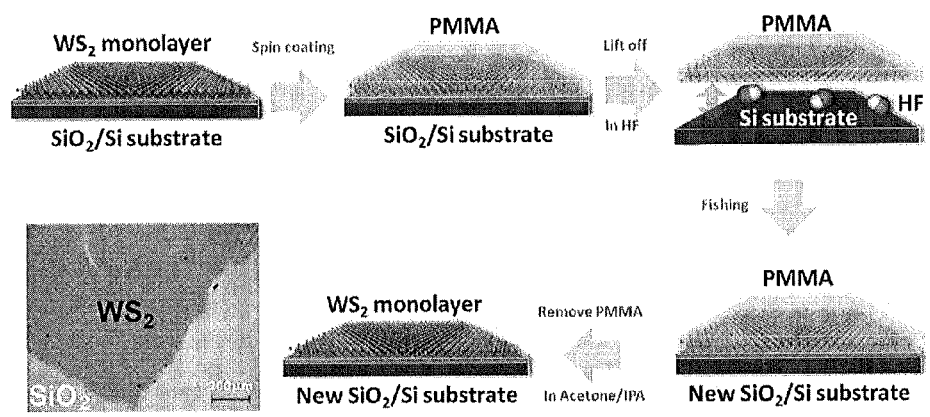
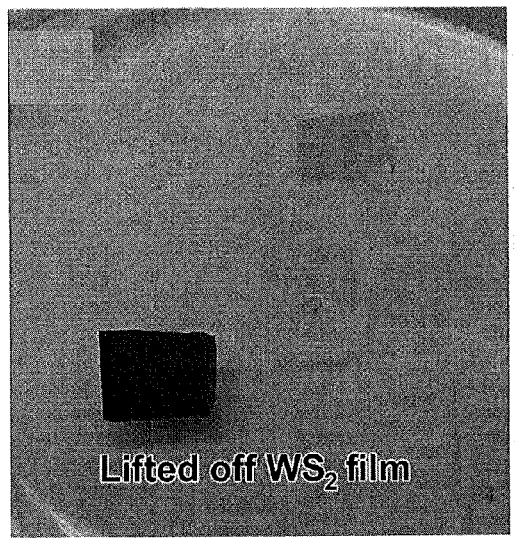
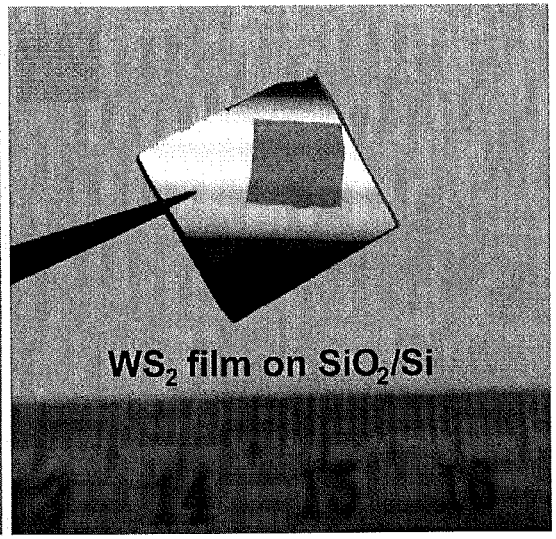
FIG. 6B
FIG. 6C FIG. 9A  FIG. 9B
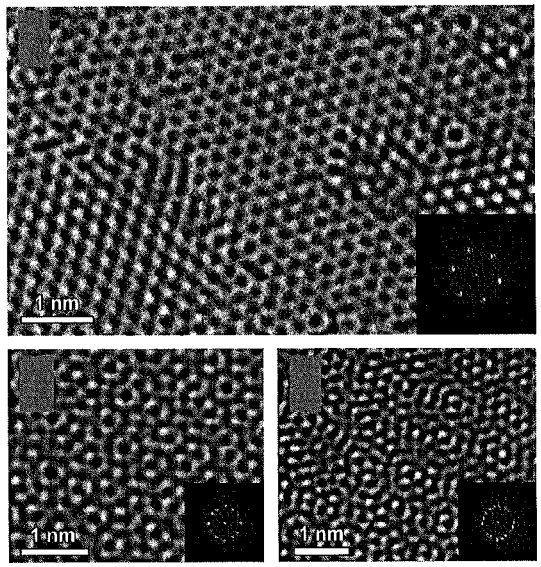
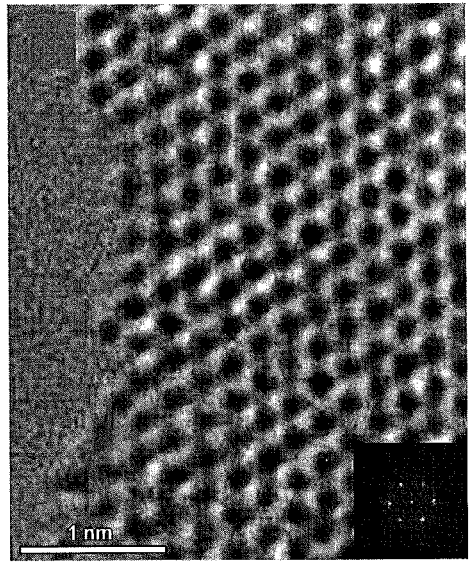
FIG. 9C  FIG. 9D

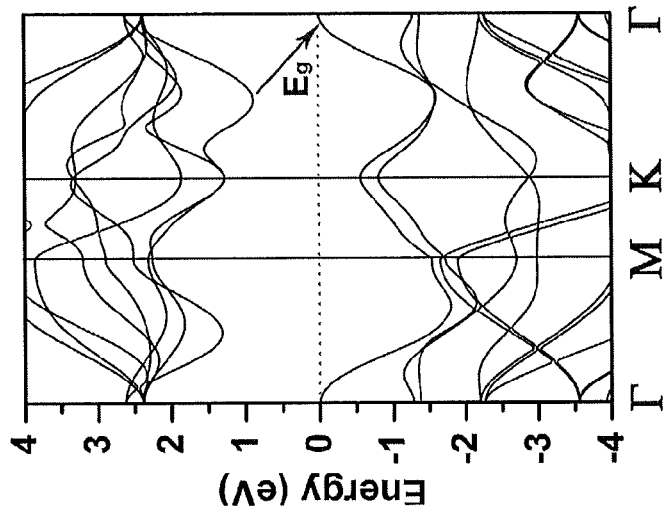
FIG. 10D   FIG. 10C
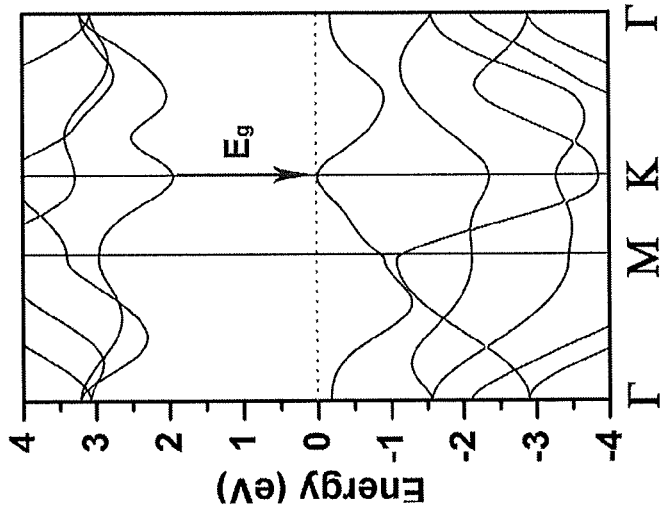
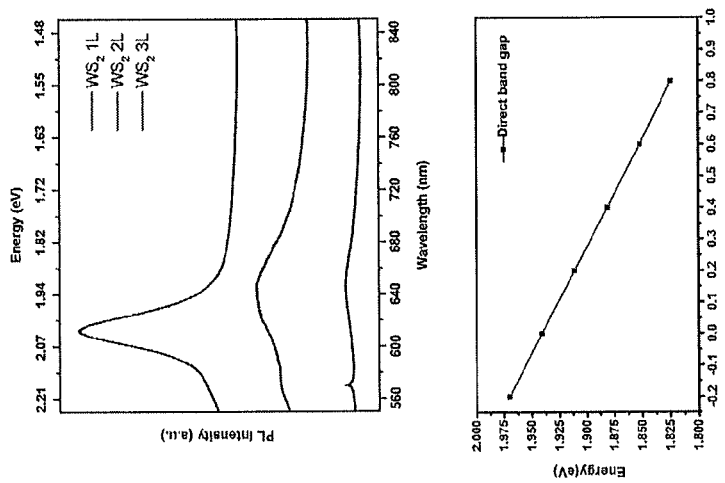
FIG. 10A   FIG. 10B
(Results in FIG. 10A, from top to bottom, are presented in the same order as those in the legend.)

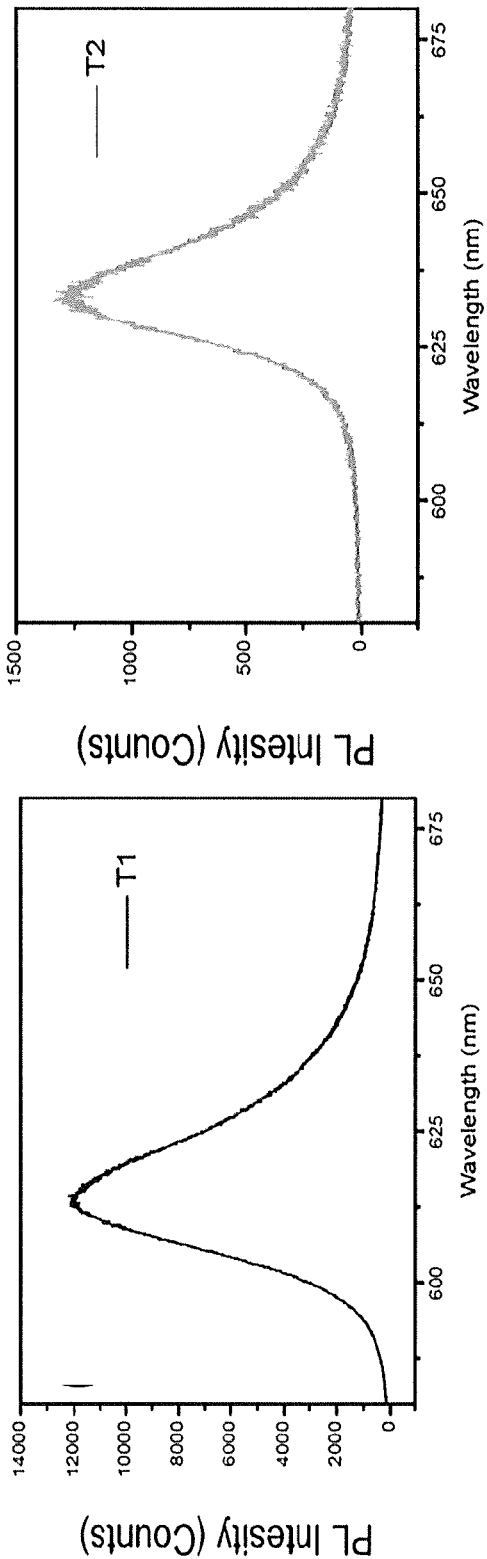

CONTROLLED SYNTHESIS AND TRANSFER OF LARGE AREA HETEROSTRUCTURES MADE OF BILAYER AND MULTILAYER TRANSITION METAL DICHALOCOGENIDES

CROSS-REFERENCE TO RELATED APPLICATIONS

This application claims benefit of U.S. Provisional Patent Application No. 61/805,461, filed on Mar. 26, 2013. That application is incorporated by reference herein.

GOVERNMENT INTEREST

This invention was made with government support under Grant No. DMR0820404 awarded by the National Science Foundation and under Contract No. W911NF-11-1-0362, awarded by the U.S. Army/ARO. The Government has certain rights in the invention.

BACKGROUND OF THE INVENTION

Field of the Invention

Embodiments of the invention relate to bilayer and multilayer transition metal dichalcogenides systems and methods of making same.

Description of the Related Art

Bulk phases of trigonal prismatic transition metal dichalcogenides (TMD) can be semiconducting, metallic, or superconducting, depending on the atomic composition. Recently, it has been found that a monolayer of semiconducting MoS2, obtained by exfoliation, exhibits a direct band gap instead of having an indirect band gap as in the bulk. The same behavior has also been found for monolayers of MX2 where M is W or Mo, and X is S or Se. Moreover, the bilayers of TMD possess an indirect band gap as the bulk. The importance of having direct band gap is that the material can have optical properties such as photoluminescence at different wave length ranges and that it also exhibits valley polarization effects.

Bulk hexagonal phases of layered semiconducting transition metal dichalcogenides (STMD) such as $MoS_2$, $WS_2$, $WSe_2$, and $MoSe_2$ exhibit indirect band gaps, and a monolayer of STMD possesses a direct band gap which could be used in the construction of optoelectronic devices, catalysts, sensors, and valleytronic components. Thus far, direct band gap has only been known to occur in mono-layered STMDs. Even bilayered STMDs exhibit indirect band gaps.

TMDs form bulk layered materials in which the layers interact via van der Waals forces, similar to graphene and hexagonal boron nitride (h-BN). This is why TMDs are good solid lubricants, including inorganic Fullerenes and nanotubes of $MoS_2$ and $WS_2$. See Fleischauer, P. D. Fundamental-Aspects of the Electronic-Structure, Materials Properties and Lubrication Performance of Sputtered $MoS_2$ Films. *Thin Solid Films* 154, 309-322, (1987); Martin, J. M., Donnet, C., Lemogne, T. & Epicier, T. Superlubricity of Molybdenum-Disulfide. *Phys. Rev. B* 48, 10583-10586, (1993); and Rapoport, L., Fleischer, N. & Tenne, R. Applications of $WS_2$ ($MoS_2$) inorganic nanotubes and fullerene-like nanoparticles for solid lubrication and for structural nanocomposites. *J. Mater. Chem.* 15, 1782-1788, (2005).

Recently, the electronic properties of few-layered $MoS_2$, $WS_2$ and $WSe_2$ have been measured. See Hwang, W. S. et al. Transistors with chemically synthesized layered semiconductor $WS_2$ exhibiting $10^5$ room temperature modulation and ambipolar behavior. *Applied Physics Letters* 101, (2012); Wang, H. et al. Integrated Circuits Based on Bilayer $MoS_2$ Transistors. *Nano Letters* 12, 4674-4680, (2012); Zhang, Y. J., Ye, J. T., Matsuhashi, Y. & Iwasa, Y. Ambipolar $MoS_2$ Thin Flake Transistors. *Nano Letters* 12, 1136-1140, (2012); and Fang, H. et al. High-Performance Single Layered WSe2 p-FETs with Chemically Doped Contacts. *Nano Letters* 12, 3788-3792, (2012).

It is important to note that monolayers of TMD are not single-atom thick, as in graphene or h-BN, but instead they are formed by layers in which the transition metal atom (W or Mo) is sandwiched between sulfur or selenium atoms (see FIGS. 1A-1D). The TMD phases possess two types of atomic arrangements: the trigonal prismatic and the octahedral, Wieting, T. K., Schluter. in *Physics and Chemistry of Materials with Layered Structures* (ed E. Mooser) (D. Reidel, Boston, 1979), and they could either exhibit semiconducting (e.g. $MoS_2$, $WS_2$, $WSe_2$ and $MoSe_2$) or metallic-superconducting behavior (e.g. $NbS_2$ and $NbSe_2$). See Wang, Q. A., Kalantar-Zadeh, K., Kis, A., Coleman, J. N., Strano, M. S. Electronics and optoelectronics of two-dimensional transition metal dichalcogenides. *Nature Nanotechnology* 7, 699-712, (2012); Kam, K. K. & Parkinson, B. A. Detailed Photocurrent Spectroscopy of The Semiconducting Group-VI Transition-Metal Dichalcogenides. *Journal of Physical Chemistry* 86, 463-467, (1982); Beal, A. R., Hughes, H. P. & Liang, W. Y. Reflectivity Spectra of Some VA Transition-Metal Dichalcogenides. *Journal of Physics C-Solid State Physics* 8, 4236-4248, (1975); Traving, M. et al. Electronic structure of $WSe_2$: A combined photoemission and inverse photoemission study. *Phys. Rev. B* 55, 10392-10399, (1997); and Finteis, T. et al. Occupied and unoccupied electronic band structure of $WSe_2$. *Phys. Rev. B* 55, 10400-10411, (1997).

Normally, the bulk hexagonal phases (trigonal prismatic) of semiconducting TMD (STMD) reveal an indirect band gap from the Γ point to an intermediate point in the Brillouin zone (Γ-I) (see FIG. 2A for the case of $WS_2$) the result has been also confirmed by first principles calculations. See Mattheis.Lf. Energy-Bands For 2H—$NbSe_2$ AND 2H-$MoS_2$. *Physical Review Letters* 30, 784-787, (1973); Boker, T. et al. Band structure of $MoS_2$, $MoSe_2$, and alpha-$MoTe_2$: Angle-resolved photoelectron spectroscopy and ab initio calculations. *Phys. Rev. B* 64, (2001); Jiang, H. Electronic Band Structures of Molybdenum and Tungsten Dichalcogenides by the GW Approach. *Journal of Physical Chemistry C* 116, 7664-7671, (2012); Cheiwchanchamnangij, T. & Lambrecht, W. R. L. Quasiparticle band structure calculation of monolayer, bilayer, and bulk $MoS_2$. *Phys. Rev. B* 85, (2012); and Enyashin, A., Gemming, S. & Seifert, G. Nanosized allotropes of molybdenum disulfide. *European Physical Journal—Special Topics* 149, 103-125, (2007). Heinz and co-workers have found that mono-layers of $MoS_2$ strongly emit light due to a 1.8 eV direct band gap at the K point in the Brillouin zone. See Mak, K. F., Lee, C., Hone, J., Shan, J. & Heinz, T. F. Atomically Thin $MoS_2$: A New Direct-Gap Semiconductor. *Physical Review Letters* 105, (2010).

This direct gap has also been confirmed experimentally by other groups through photoluminescence in exfoliated $MoS_2$, Splendiani, A. et al. Emerging Photoluminescence in Monolayer $MoS_2$. *Nano Letters* 10, 1271-1275, (2010), Korn, T., Heydrich, S., Hirmer, M., Schmutzler, J. & Schuller, C. Low-temperature photocarrier dynamics in monolayer $MoS_2$. *Applied Physics Letters* 99, (2011), and Eda, G. et al. Photoluminescence from Chemically Exfoliated MoS$_2$. *Nano Letters* 11, 5111-5116, (2011), and chemical vapor deposition islands of monolayer WS$_2$ (see FIG. 2B).

So far, it has been not been reported theoretically or experimentally that it is possible to generate a direct band gap in bilayer and multilayer systems if the layers and the stackings are different in chemical composition.

BRIEF SUMMARY OF THE INVENTION

Embodiments are presented herein that provide bilayer or multilayer TMD systems and methods of making same that have direct band gap in the bilayer and multilayer systems. The arrangement of layers of different TMDs of the type MX$_2$ where M=Mo, W, Nb, and X=S, Se, and Te, form bilayer or multiple layers with different stackings. The materials used exhibit different semiconducting band gaps and metallic behaviors depending on the composition. The gaps can be direct in the bilayer and multilayer systems, and can range from 0.8 eV to 1.16 eV.

In one embodiment, the metallic systems which involve one layer of NbX$_2$, wherein X is S or Se, can be used as contacts for completely new self-contained 2-D electronic devices.

In another embodiment, the synthesis of these new systems involves the chemical sulfurization or selenization of the transition metal oxide at different stages.

In yet another embodiment, a synthesis method of large area monolayers and multilayer systems based on different stackings and different TMDs is described as a modified chemical vapor deposition procedure which includes the mixture of different atomic species. The results indicate that it is possible to scale up the procedure with different chemicals to fabricate different layers of TMD.

In another embodiment, using first principles calculations, by alternating individual layers of different STMD (MoS$_2$, WS$_2$, WSe$_2$, and MoSe$_2$) with particular stackings, it is possible to generate direct band gap bi-layers ranging from 0.79 eV to 1.157 eV. In this direct band gap, electrons and holes are physically separated and localized in different layers.

The alternation of different STMD will result in the fabrication of new materials with unprecedented optical and physic-chemical properties.

DETAILED DESCRIPTION OF THE FIGURES

FIGS. 1A-1D shows atomic models representing the bilayer heterostructures of semiconducting transition metal dichalcogenides (STMD). FIG. 1A shows bilayers formed by overlapping WSe$_2$ on WS$_2$ with stacking type B (bulk) denoted as Bilayer (WS$_2$,WSe$_2$,B); FIG. 1B shows bilayers formed by placing WSe$_2$ on MoS$_2$ with stacking type A denoted as Bilayer (MoS$_2$,WSe$_2$,A); FIG. 1C shows stacking type B in which the transition metal atoms are on top of the chalcogen atoms. This is the stacking found in bulk STMD. FIG. 1D shows stacking type A in which the chalcogen atoms are on top of each other. The dotted lines indicate the alignment of atoms between layers, and the arrows correspond to the distance dS—Se between chalcogen atoms of different layers.

FIG. 2A shows band structure of bulk hexagonal WS$_2$ (the arrow shows the indirect gap Γ-I); FIG. 2B shows band structure of a monolayer of WS$_2$ (note the arrow revealing the direct band gap location); FIG. 2C shows type 1 family of WS$_2$—MoS$_2$ showing the band structure of the bilayer with an A stacking; FIG. 2D shows type 2 family band structure showing the direct band gap of bilayer (WS$_2$, WSe$_2$,B); FIG. 2E shows type 2 family band structure of the direct band gap corresponding to the bilayer (WSe$_2$,MoS$_2$, A), and FIG. 2F shows the Type 2 family, band structure of the infinite number of layers case: Crystal (WS$_2$,WSe$_2$,A). The horizontal line at zero indicates the top of the valence band.

FIGS. 3A-3C show bilayer (WSe2, WS2,B). FIG. 3A shows band structure. FIG. 3B shows PDOS considering the d-electrons of tungsten; FIG. 3C shows PDOS considering the p-electrons of the chalcogen atoms Se or S at different layers.

FIGS. 4A-4F show a bilayer composition with the structure (WSe$_2$,WS$_2$,A): FIG. 4A shows band structure showing the direct band gap; FIG. 4B shows PDOS showing the d-electrons of W at each of the layers. The arrows indicate the states at the top of the valence band caused by W in the WSe$_2$ layer, and the states at bottom of the conduction band due to W in the WS$_2$ layer; FIG. 4C shows PDOS showing the p-electrons of the chalcogen atoms. The arrows exhibits the states at the top of the valence band of Se in the WSe$_2$ layer, and reveal the states at the bottom of the conduction band of the S atoms in the WS$_2$ layer; FIG. 4D shows DFT-LDA calculated phonon dispersion for the WS$_2$ monolayer is in dotted lines, and the bilayer (WS2,WSe2,B). The phonon density of states is shown (right hand side), and FIG. 4E shows DFT-LDA Raman intensities due to the different phonon modes in the bilayer (WS2-WSe2,B) using a laser wave length of 514.5 cm$^{-1}$ at 300 K.

FIG. 5A shows a schematic representation of the experimental setup used for the synthesis of TMD films involving high temperature treatments under a Sulfur/Argon environment at low pressures (450 mTorr), and FIG. 5B shows the temperature ramp used for sulfurization experiments.

FIG. 6A shows a schematic representation of the developed polymethyl methacrylate (PMMA)-assisted transfer method onto different substrates, FIG. 6B shows a photograph of the WS$_2$ film floating on hydrofluoric acid (HF). FIG. 6C shows a photograph of a WS$_2$ film on a SiO$_2$/Si substrate, exhibiting the high contrast and color change (films are cyan color).

FIG. 8A shows 514.5 nm and FIG. 8B shows 488 nm. The laser line excitation corresponds to 514.5 nm.

FIGS. 9A-9D show high resolution transmission electron microscopy (HRTEM) images of WS$_2$ films. Insets show the Fast Fourier Transformation (FFT) of the corresponding TEM micrograph. FIG. 9A shows WS$_2$ region with at least two different thicknesses, according to the FFT. FIG. 9B and FIG. 9C, respectively, exhibit a bilayer and trilayer WS$_2$ with different stacking, revealed by the formed Moire pattern and confirmed by the FFT, and FIG. 9D depicts the edge of a single layer WS$_2$ film.

FIG. 10A shows photoluminescence (PL) spectrum of a single layered WS$_2$ film, showing a well formed peak at around 2 eV and a shoulder around 2.16 eV. FIG. 10B shows energy band gap of single layered WS$_2$ vs. expansion of the lattice. FIG. 10C shows band structure of single layer WS$_2$. FIG. 10D shows band structure of bulk WS$_2$.

Figure 11C:
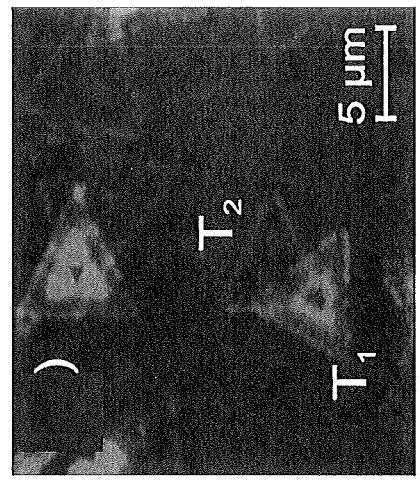
Figure 11B:
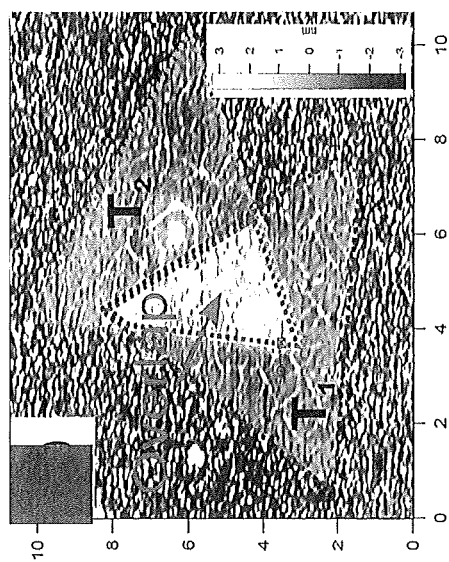
Figure 11A:
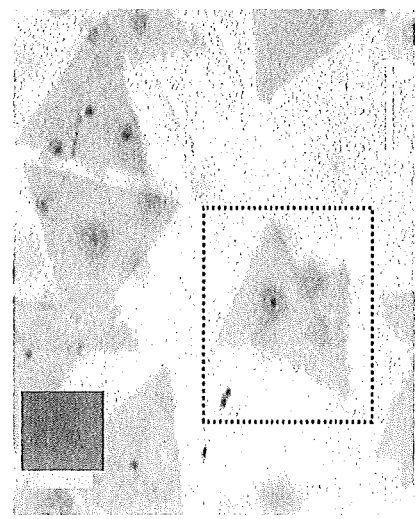
Figure 11F:
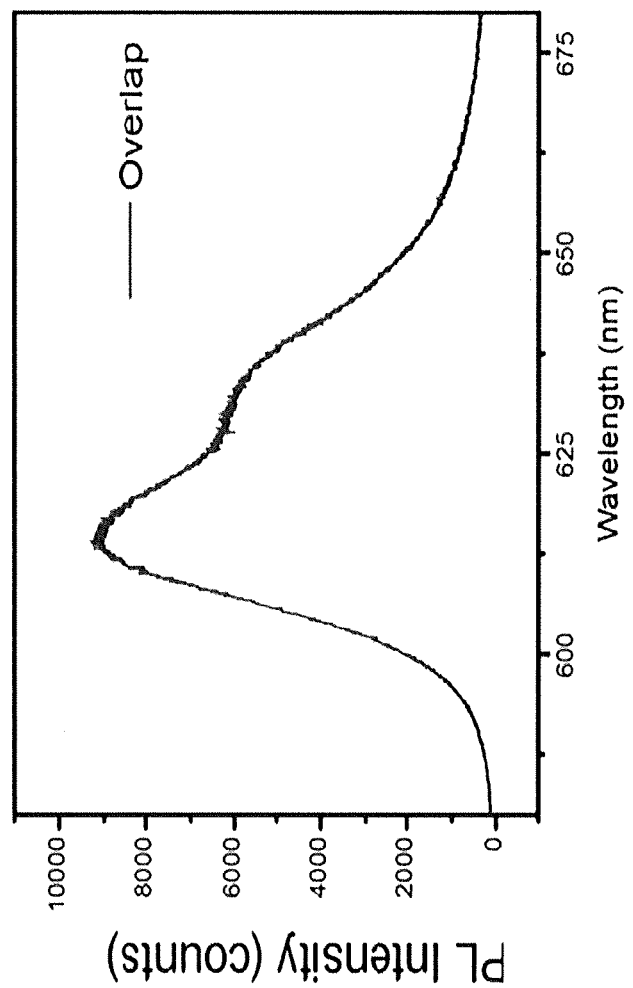

FIG. 11A shows monochromatic optical image of the overlapped triangles. FIG. 11B shows AFM topography micrograph. FIG. 11C shows a fluorescence image. FIG. 11D shows a PL spectrum of the triangle labeled T1. FIG. 11E shows PL spectrum of the triangle labeled T2, and FIG. 11F shows PL spectrum of the overlapped region with increase intensity. All spectra were acquired with 488 nm laser excitation.

DETAILED DESCRIPTION OF THE INVENTION

We have found that direct band gaps may be obtained by sandwiching different metal disulfides and diselenides.

We have demonstrated, for the first time, that it is possible to obtain novel direct band gap bilayers of STMD if different monolayers are overlapped. Moreover, in some cases it is possible to have direct band gap crystals with an infinite number of layers if the stacking belongs to A type. The direct band gap bilayers exhibit a physical separation of electron and holes probably due to a sort of local Giant Stark Effect caused by charge differences established between the heterogeneous layers. In these systems, the top of the valence band is dominated by the selenide layer and the bottom of the conduction band is controlled by the states of the sulfide layer. Homogeneous bilayers of TMD do not possess this net charge separation and hence do not exhibit direct band gaps. In addition, this is a different behavior from that found for monolayers of STMD, in which electrons and holes are restricted to interact within the layer.

In particular, the family of $WS_2$—$WSe_2$ and $MoS_2$—$WSe_2$ bilayers behave like a direct band gap material for the two stackings (A and B; being B the most stable). These 2D layered systems can be synthesized by sandwiching exfoliated monolayers or chemical vapor deposition layers, using a careful transfer of the monolayers. Moreover, this family could also produce a direct band gap crystal with A stacking. In addition, the family of hybrids $WS_2$—$MoSe_2$ and $MoS_2$—$MoSe_2$, besides having a direct band gap for A stackings, exhibit an indirect gap at Γ-K for a bilayer with stacking type B, a result which has not been reported hitherto for STMD. Another relevant feature is that the distance between layers increases for type A stackings, found to be the least favorable energetically speaking (see Table 2 supplementary information).

TABLE 2

| Hybrid Structure | Bilayer stacking A | Bilayer stacking B | Crystal stacking A | Crystal stacking B |
| --- | --- | --- | --- | --- |
| $WS_2$_$MoS_2$ Type 1 | 0.1882 | 0.1138 | 0.1471 | 0 |
| $WS_2$_$WSe_2$ Type 2 | 0.1922 | 0.1164 | 0.1494 | 0 |
| $MoS_2$_$WSe_2$ Type 2 | 0.2061 | 0.1245 | 0.1613 | 0 |
| $WS_2$_$MoSe_2$ Type 3 | 0.1948 | 0.1180 | 0.1517 | 0 |
| $MoS_2$_$MoSe_2$ Type 3 | 0.2098 | 0.1264 | 0.1645 | 0 |
| $WSe_2$_$MoSe_2$ Type 4 | 0.2088 | 0.1262 | 0.1632 | 0 |

Relative energies in eV of hybrid STMD with respect to their corresponding crystal phase.

However, by twisting the layers or by changing the stacking, new cases with more favorable energetics were found. It is important to mention that the direct band gaps of the hybrid systems range from 0.79 eV (1569.42 nm) to 1.15 eV (1078.12 nm), which are much smaller than the direct band gaps, already found experimentally in monolayers of $WS_2$ (2.1 eV) and $MoS_2$ (1.8 eV). See Wang, Q. A., Kalantar-Zadeh, K., Kis, A., Coleman, J. N., Strano, M. S. Electronics and optoelectronics of two-dimensional transition metal dichalcogenides. *Nature Nanotechnology* 7, 699-712, (2012).

The novel hybrid bilayer systems exhibit new optical properties useful for applications in the infrared range. With the hybrid layer technology at hand, it is possible to experimentally produce bilayer hybrid systems with novel photoluminescence properties. Note that in these bilayer systems there is no inversion symmetry, so they might play an important role in valley polarization and valleytronics.

For this case, the direct band gap is around 1.9 eV, Gutierrez, H. R., Perea-Lopez, N., Elias, A. L., Berkdemyr, A., Wang, B., L V, R., Lopez-Urias, F., Crespi, V. H., Terrones, H., Terrones, M. Extraordinary Room-Temperature Photoluminescence in Triangular $WS_2$ Monolayers. *Nano Letters DOI* 10.1021/nl3026357, (2012). See FIG. 2B. Besides the transformation to a direct band gap for a monolayer of STMD, a break of inversion symmetry also occurs, Xiao, D., Liu, G. B., Feng, W. X., Xu, X. D. & Yao, W. Coupled Spin and Valley Physics in Monolayers of $MoS_2$ and Other Group-VI Dichalcogenides. *Physical Review Letters* 108, (2012), which has been confirmed experimentally by circularly polarized light experiments that lead to valley polarization effects. See Zeng, H. L., Dai, J. F., Yao, W., Xiao, D. & Cui, X. D. Valley polarization in $MoS_2$ monolayers by optical pumping. *Nature Nanotechnology* 7, 490-493, (2012); and Mak, K. F., He, K. L., Shan, J. & Heinz, T. F. Control of valley polarization in monolayer $MoS_2$ by optical helicity. *Nature Nanotechnology* 7, 494-498, (2012).

To date, various groups have performed first principles calculations using Local density approximation (LDA), Generalized gradient approximation-Perdew-Burke-Ernzerhof (GGA-PBE), Hybrid-DFT Heyd-Scuseria-Ernzerhof (HSE), many body perturbation theory under the GW approximation (including excitonic and spin orbit coupling effects), in order to obtain the band structure with more precision and explain the experimental reported observations. See Boker, T. et al. Band structure of $MoS_2$, $MoSe_2$, and alpha-$MoTe_2$: Angle-resolved photoelectron spectroscopy and ab initio calculations. *Phys. Rev. B* 64, (2001); Jiang, H. Electronic Band Structures of Molybdenum and Tungsten Dichalcogenides by the GW Approach. *Journal of Physical Chemistry C* 116, 7664-7671, (2012); Cheiwchanchamnangij, T. & Lambrecht, W. R. L. Quasiparticle band structure calculation of monolayer, bilayer, and bulk $MoS_2$. *Phys. Rev. B* 85, (2012); Lebegue, S., Pillet, S. & Angyan, J. G. Modeling spin-crossover compounds by periodic DFT+U approach. *Phys. Rev. B* 78, (2008); Ramasubramaniam, A. Large excitonic effects in monolayers of molybdenum and tungsten dichalcogenides. *Phys. Rev. B* 86, (2012); Li, T. S. & Galli, G. L. Electronic properties of $MoS_2$ nanoparticles. *Journal of Physical Chemistry C* 111, 16192-16196, (2007); Kuc, A., Zibouche, N. & Heine, T. Influence of quantum confinement on the electronic structure of the transition metal sulfide $TS_2$. *Phys. Rev. B* 83, (2011); Ramasubramaniam, A., Naveh, D. & Towe, E. Tunable band gaps in bilayer transition-metal dichalcogenides. *Phys. Rev. B* 84, (2011); Ding, Y. et al. First principles study of structural, vibrational and electronic properties of graphene-like MX2 (M=Mo, Nb, W, Ta; X=S, Se, Te) monolayers. *Physica B—Condensed Matter* 406, 2254-2260, (2011). Although there are differences in the band gaps due to the particular theoretical approach used, all these calculations agree in the main features of the band structure and in the existence of direct band gaps for monolayers of STMD and indirect gaps in bilayers and multilayer systems.

When a second layer of the same dichalcogenide is added to the monolayer, the indirect band gap from the Γ point to an intermediate state (Γ-I) becomes significant, Cheiwchanchamnangij, T. & Lambrecht, W. R. L. Quasiparticle band structure calculation of monolayer, bilayer, and bulk $MoS_2$. *Phys. Rev. B* 85, (2012), and the system loses the direct band gap character. Therefore, the direct band gap at the K point is restricted to monolayers of STMD.

To understand further this issue, we have also performed first principles calculations on different stackings and rotations of one layer with respect to another in the bilayer systems of the same dichalcogenide, and found the absence of a direct band gap even for twisted bilayers. However, when considering the stacking of different bilayers of STMD (e.g. $WS_2$—$MoS_2$, $WSe_2$—$MoS_2$ $MoSe_2$—$MoS_2$, $WSe_2$—$MoSe_2$, etc.), the direct band gap at the K point becomes dominant, similar to monolayers. Moreover, in some of these geometries the alternated layers can result in an infinite hybrid crystal with a direct band gap. According to the band structure analysis, the main features are the presence of a direct band gap at the K point, as well as the presence of particular indirect gaps. In this context, four families of hybrid STMD have been identified: $WS_2$—$MoS_2$ as type 1, $WSe_2$—$WS_2$ and $WSe_2$—$MoS_2$ as type 2, $MoSe_2$—$WS_2$ and $MoSe_2$—$MoS_2$ as type 3 and $WSe_2$—$MoSe_2$ as type 4 (see FIG. 1).

Embodiments also relate to cumulative buildup of photoluminescence intensity in artificially stacked TMD monolayers. Monolayers of TMDs emit light efficiently at different temperatures, due to the transformation of the electronic structure of the material when a single layer is isolated. We have found that following our synthesis and transfer method as reported herein, the photoluminescence (PL) signal of stacked monolayers (very weakly interacting) can be multiplied as the numbers of layers increase. In some embodiments it is multiplied at least 10 times, at least 20 times, at least 30 times, at least 40 times, at least 50, or at least 60 times. Under standard conditions the layers interact by van der Waals forces, in such case the amount of light emitted by bi- and/or multi-layers is orders of magnitude smaller than that of one monolayer.

In our system, the light emission can build up due to the very weak layer interaction between monolayers stacked one on top of another. FIG. 11A shows the optical image of two overlapped triangular monolayers of $WS_2$ that were transferred chemically on top of a monolayer another $WS_2$ monolayer. FIG. 11B corresponds to the Atomic Force Microscopy (AFM) image showing the overlapped region (two monolayers) exhibits a thickness close to 1.8 nm that corresponds to weak a layer interaction (a tight layer interaction corresponds to >0.662 nm). FIG. 11C depicts the fluorescence image obtained when shining green light (wavelength of 530 nm). The light emission was collected using a high-pass red filter (Cutoff~600 nm). This image shows the overlap region with stronger fluorescence than that observed for individual triangular monolayers. Spectroscopic evidence of this behavior is presented in FIGS. 11D-11F. In particular, FIGS. 11D and 11E reveal the PL spectra of each isolated monolayer. Finally the spectrum shown in FIG. 1F presents the accumulated PL emission from two weakly interacting stacked layers. The behavior observed here, is the proof of concept that TMDs could be used as efficient light emitting sources when monolayers stack on one another with relatively weak interactions and spacing >0.62 nm. We estimated that in a film fabricated by weakly stacking different monolayers, it is possible to integrate 50 monolayers in 100 nm, this will render a light generation 50 times stronger than the monolayer.

Methods

Calculations were performed using the plane wave code CASTEP, Clark, S. J. et al. First principles methods using CASTEP, *Zeitschrift Fur Kristallographie* 220, 567-570, (2005), as implemented in the Materials Studio, on hexagonal cells under the Local Density Approximation (LDA) considering the Ceperly-Alder-Perdew and Zunger (CA-PZ), Ceperley, D. M. & Alder, B. J. Ground-State of The Electron-Gas by a Stochastic Method. *Physical Review Letters* 45, 566-569, (1980); and Perdew, J. P. & Zunger, A. Self-Interaction Correction to Density-Functional Approximations for Many-Electron Systems. *Phys. Rev. B* 23, 5048-5079a, (1981), functional with 13×13×3 Monkhorst-Pack K-points and a plane waves cut off of 500 eV. All the structures were relaxed, including the cells, until the forces became smaller to 0.01 eV/Å and the energy tolerances were less to $5 \times 10^{-6}$ eV/atom. A vacuum of 16 Å between the bilayers was considered. In order to select the optimum approach for interlayer distances, van der Waals interactions were considered through a dispersion correction (DFT-D), Ortmann, F., Bechstedt, F. & Schmidt, W. G. Semiempirical van der Waals correction to the density functional description of solids and molecular structures. *Phys. Rev. B* 73, (2006), under both, LDA and General Gradient Approximation (GGA-PW91). See Perdew, J. P. et al. Atoms, Molecules, Solids, And Surfaces-Applications of the Generalized Gradient Approximation for the Exchange and Correlation. *Phys. Rev. B* 46, 6671-6687, (1992). To test the results, several TMD structures were calculated such as $WS_2$, $MoS_2$, $WSe_2$, $MoSe_2$, $NbSe_2$, $NbS_2$ and compared with the experimental data available (see Table 5).

TABLE 5

| Structure | Indirect Gap (eV) | Direct Gap (eV) | ΔGap (eV) | Lattice "a" (Å) | Relative Energy/ cell (eV) |
|---|---|---|---|---|---|
| Bilayer ($WS_2$, A) | 1.762 | 1.922 | 0.160 | 3.145 | 0.1797 |
| Bilayer ($WS_2$, B) | 1.357 | 1.890 | 0.533 | 3.146 | 0.1089 |
| Crystal ($WS_2$, A) | 1.755 (K-I) 2.318 (Γ-I) | 1.984 | 0.229 (K-I) −0.333 (Γ-I) | 3.146 | 0.1402 |
| Crystal ($WS_2$, B) | 0.883 | 1.829 | 0.946 | a = 3.147 (3.155 exp[33]) c = 12.166 (12.35 exp[33]) | 0 |
| Single-Layer $WS_2$ | 2.209 | 1.940 | −0.268 | 3.146 | 0.2198 |
| Bilayer ($MoS_2$, A) | 1.589 | 1.801 | 0.213 | 3.167 | 0.1975 |
| Bilayer ($MoS_2$, B) | 1.112 | 1.773 | 0.662 | 3.168 | 0.1190 |
| Crystal ($MoS_2$, A) | 1.642 (K-I) 2.131 (Γ-I) | 1.847 | 0.205 (K-I) −0.285 (Γ-I) | 3.168 | 0.1556 |
| Crystal ($MoS_2$, B) | 0.706 | 1.714 | 1.008 | a = 3.170 (3.160 exp[33]) c = 12.106 (12.29 exp[33]) | 0 |
| Single-Layer $MoS_2$ | 2.031 | 1.823 | −0.207 | 3.167 | 0.2398 |
| Bilayer ($MoSe_2$, A) | 1.432 (K-I) 1.548 (Γ-I) | 1.579 | 0.147 (K-I) 0.031 (Γ-I) | 3.286 | 0.2163 |

TABLE 5-continued

| Structure | Indirect Gap (eV) | Direct Gap (eV) | ΔGap (eV) | Lattice "a" (Å) | Relative Energy/cell (eV) |
|---|---|---|---|---|---|
| Bilayer (MoSe$_2$, B) | 1.047 (Γ-I) | 1.550 | 0.5039 | 3.287 | 0.1302 |
| Crystal (MoSe$_2$, A) | 1.347 (K-I) 2.036 (Γ-I) | 1.629 | 0.282 (K-I) −0.407 (Γ-I) | 3.286 | 0.1704 |
| Crystal (MoSe$_2$, B) | 0.686 (Γ-I) | 1.483 | 0.797 | a = 3.290 (3.288 exp$^{38}$) c = 12.779 (12.931 exp$^{38}$) | 0 |
| MoSe$_2$, -Single-Layer | 1.973 | 1.606 | −0.367 | 3.285 | 0.2628 |

STMD properties as calculated with LDA in this application: Showing the indirect band gap, the direct band gap, the difference between direct and indirect gap, lattice parameters and relative energies per cell.

The lattice constant experimental values exhibit good agreement with the LDA approach (without considering the dispersion correction DFT-D). For the LDA-DFT-D, the layers get closer to each other producing a compactification of the "c" lattice parameter (around 3.6% smaller than bulk), whereas with the GGA-DFT-D approach, the layers get farther apart thus producing a lattice with a much larger "c" parameter (around 3.5% bigger than bulk). The lattice "c" parameters obtained with LDA produce the best fit within 1.5% or less of those reported experimentally. Moreover, our results are in agreement with those reported by other groups within the LDA formalism. See Ding, Y. et al. First principles study of structural, vibrational and electronic properties of graphene-like MX2 (M=Mo, Nb, W, Ta; X=S, Se, Te) monolayers. *Physica B—Condensed Matter* 406, 2254-2260, (2011); and Mahatha, S. K., Patel, K. D. & Menon, K. S. R. Electronic structure investigation of MoS2 and MoSe2 using angle-resolved photoemission spectroscopy and ab initio band structure studies. *Journal of Physics—Condensed Matter* 24, (2012).

Although DFT first principles calculations underestimate the band gaps, DFT-LDA provides a good approximation for the direct band gaps in STMD systems. Therefore, LDA was used for all the calculations. The phonon density of states and the phonon dispersion were calculated with the above parameters, but extending the plane wave cut off to 720 eV using the density functional perturbation theory as implemented in the CASTEP code which uses the linear response methodology that works well for insulators. See Refson, K., Tulip, P. R. & Clark, S. J. Variational density-functional perturbation theory for dielectrics and lattice dynamics. *Phys. Rev. B* 73, (2006).

Results

Family of Hybrids WS$_2$—MoS$_2$ (Type 1)

For all the performed first principles calculations, two types of stackings were selected to overlap the monolayers of STMD: First, was the crystal stacking found in the bulk phases; the letter B (bulk) is used to indicate this type of stacking. In particular, for stacking type B, the S (Se) atoms of one layer sit on top of the metal atoms of the other layer (see FIGS. 1A and 1C). The second stacking contemplated in our study, consists of S (Se) atoms arranged on top of the S (Se) atoms of the adjacent layer (see FIG. 1B and FIG. 1D); this is referred to as A stacking.

For the hybrid layers of MoS$_2$ and WS$_2$ arranged in a bilayer with a stacking type B, we introduced the notation: bilayer(MoS$_2$,WS$_2$,B); in which the first two symbols within the brackets refer to the STMD considered and the next symbol indicates the stacking type (A or B). We have also considered infinite crystal cases (infinite number of layers) with stackings type A and B as crystal(MoS$_2$,WS$_2$,A) and crystal(MoS$_2$,WS$_2$,B), respectively. For all the cases of this family (hybrids MoS$_2$—WS$_2$), there was an absence of a dominant direct band gap. The gap difference between the direct gap at K and indirect gap Γ-I for the A stackings is reduced when compared to the corresponding difference in stackings of type B (see table 1 and FIG. 2C). Table 1 shows direct and indirect (in parenthesis) band gaps in eV of hybrids of semiconducting transition metal dichalcogenides (STMD). Systems with a dominant direct band gap at the K point in the Brillouin zone have an asterisk. Cases with "+" show an indirect fundamental band gap Γ-K, and "&" corresponds to a dominant indirect gap K-I.

TABLE 1

| Hybrid Structure | Bilayer stacking A | Bilayer stacking B | Crystal stacking A | Crystal stacking B |
|---|---|---|---|---|
| WS$_2$—MoS$_2$ Type 1 | 1.695 (1.586 Γ-I) | 1.708 (1.190 Γ-I) | 1.669 (1.284 Γ-I) | 1.664 (0.764 Γ-I) |
| WS$_2$—WSe$_2$ Type 2 | 1.007 (1.725 Γ-I)* | 1.068 (1.314 Γ-I)* | 1.007 (1.406 Γ-I)* | 1.037 (0.883 Γ-I) |
| MoS$_2$—WSe$_2$ Type 2 | 0.790 (1.525 Γ-I)* | 0.891 (1.147 Γ-I)* | 0.802 (1.245 Γ-I)* | 0.883 (0.736 Γ-I) |
| WS$_2$—MoSe$_2$ Type 3 | 1.154 (1.594 Γ-I)* | 1.180 (1.052 Γ-K)+ 1.157 (1.316 Γ-I)* | | 1.155 (0.790 Γ-I) |
| MoS$_2$—MoSe$_2$ Type 3 | 0.945 (1.560 Γ-I)* | 1.013 (0.899 Γ-K)+ 0.949 (1.260 Γ-I)* | | 0.998 (0.699 Γ-I) |
| WSe$_2$—MoSe$_2$ Type 4 | 1.443 (1.330 K-I)& | 1.471 (1.116 Γ-I) | 1.444 (1.215 K-I)& | 1.418 (0.761 Γ-I) |

This gap reduction is due to an increase in the indirect gap at Γ-I for the stacking A cases. The direct gap at the K point changes very little in these systems, from 1.664 eV for crystal (MoS$_2$,WS$_2$,B) to 1.708 eV for bilayer (MoS$_2$,WS$_2$,B), whereas the indirect gap Γ-I changes more dramatically from 0.764 eV in the crystal (MoS$_2$,WS$_2$,B) to 1.586 eV for the bilayer (MoS$_2$,WS$_2$,A). Regarding stability, the total energy/cell (one cell contains one unit of WS$_2$ and one unit of MoS$_2$) always favors the stackings type B with a difference of 0.1138 eV/cell for the crystals and 0.0744 eV/cell for the bilayers (see Table 2). The lattice parameters "a" for this family varies very little from 3.155 Å for the bilayer (MoS$_2$,WS$_2$,A) to 3.158 Å for the crystal (MoS$_2$,WS$_2$,B), thus lying between the lattice constants of WS$_2$ and MoS$_2$ crystals. See Wildervanck, J. C. & Jellinek, F. Preparation and crystallinity of molybdenum and tungsten sulfides. *Zeitschrift Fur Anorganische Und Allgemeine Chemie* 328, 309-318, (1964). See table 3 The bond lengths (Mo—S and W—S) are basically the same as in the corresponding monolayer (see Table 4).

TABLE 4

| Hybrid-Structure | Bilayer stacking A | Bilayer stacking B | Crystal stacking A | Crystal stacking B |
|---|---|---|---|---|
| $WS_2\_MoS_2$ Type 1 | MoS = 2.415 | MoS = 2.415 | MoS = 2.415 | MoS = 2.416 |
| | W_S = 2.402 | W_S = 2.403 | W_S = 2.402 | W_S = 2.403 |
| $WS_2\_WSe_2$ Type2 | W_S = 2.412 | W_S = 2.414 | W_S = 2.412 | W_S = 2.413 |
| | W_Se = 2.508 | W_Se = 2.508 | W_Se = 2.509 | W_Se = 2.510 |
| $MoS_2\_WSe_2$ Type 2 | Mo_S = 2.428 | Mo_S = 2.427 | Mo_S = 2.428 | Mo_S = 2.430 |
| | W_Se = 2.510 | W_Se = 2.512 | W_Se = 2.511 | W_Se = 2.512 |
| $WS_2\_MoSe_2$ Type 3 | W_S = 2.413 | W_S = 2.413 | W_S = 2.413 | W_S = 2.415 |
| | Mo_Se = 2.518 | Mo_Se = 2.520 | Mo_Se = 2.518 | Mo_Se = 2.520 |
| $MoS_2\_MoSe_2$ Type 3 | Mo_S = 2.429 | Mo_S = 2.429 | Mo_S = 2.429 | Mo_S = 2.431 |
| | Mo_Se = 2.520 | Mo_Se = 2.522 | Mo_Se = 2.521 | Mo_Se = 2.522 |
| $WSe_2\_MoSe_2$ Type | Mo_Se = 2.530 | Mo_Se = 2.531 | Mo_Se = 2.529 | Mo_Se = 2.531 |
| | W_Se = 2.521 | W_Se = 2.520 | W_Se = 2.521 | W_Se = 2.523 |
| $WS_2$ single layer | W_S = 2.401 | | | |
| $MoS_2$ single layer | Mo_S = 2.417 | | | |
| $WSe_2$ single layer | W_Se = 2.519 | | | |
| MoSe single layer | Mo_Se = 2.530 | | | |

Distance between the transition metal (Mo,W) and the chalcogen atoms (S,Se) in Å.

Family of Hybrids $WS_2$—$WSe_2$ and $MoS_2$—$WSe_2$ (Type 2)

Figure 3A:
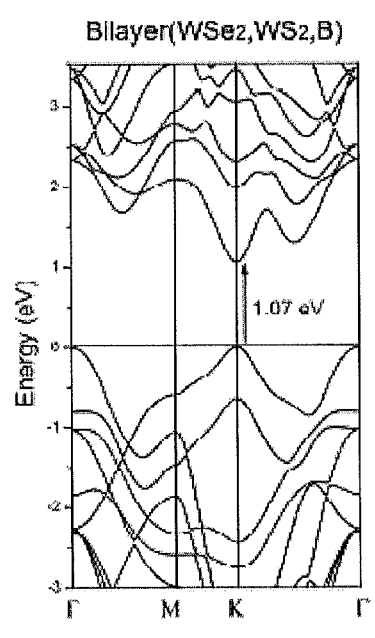
Figure 3B:
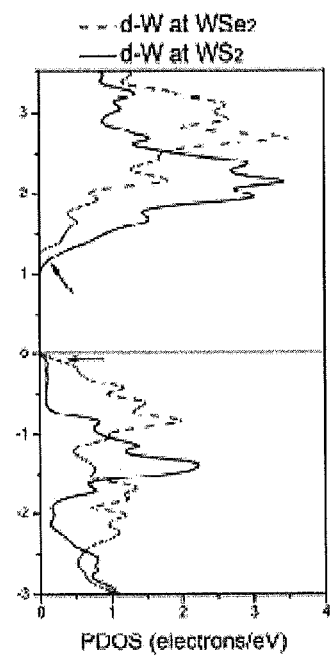
Figure 3C:
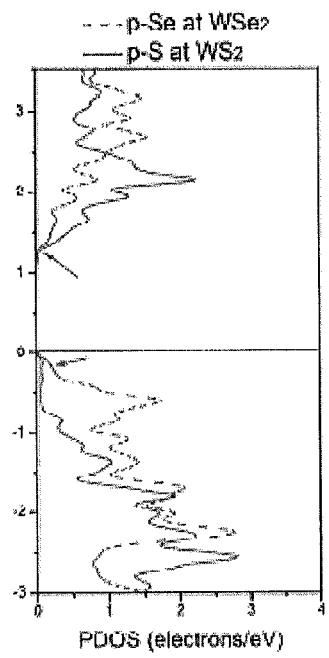
Figure 4A:
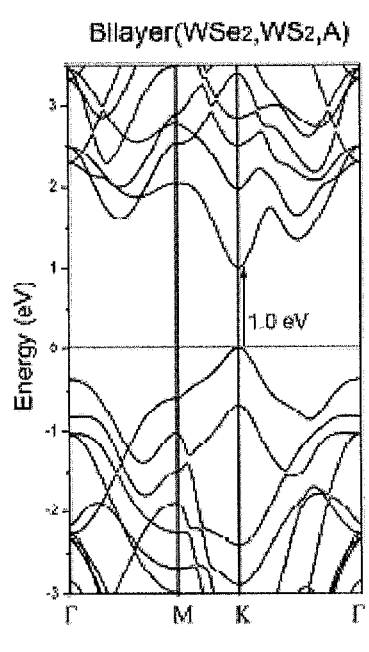
Figure 4B:
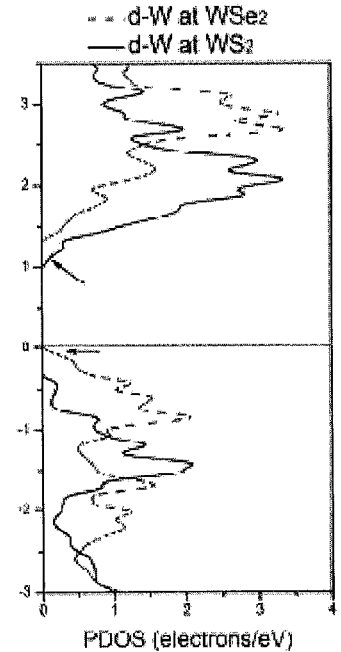
Figure 4C:
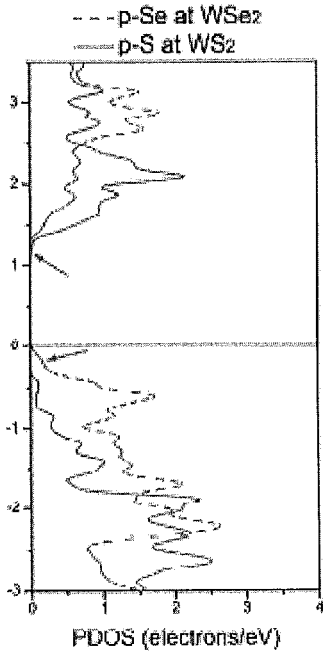
Figures 4D, 4E, 4F:
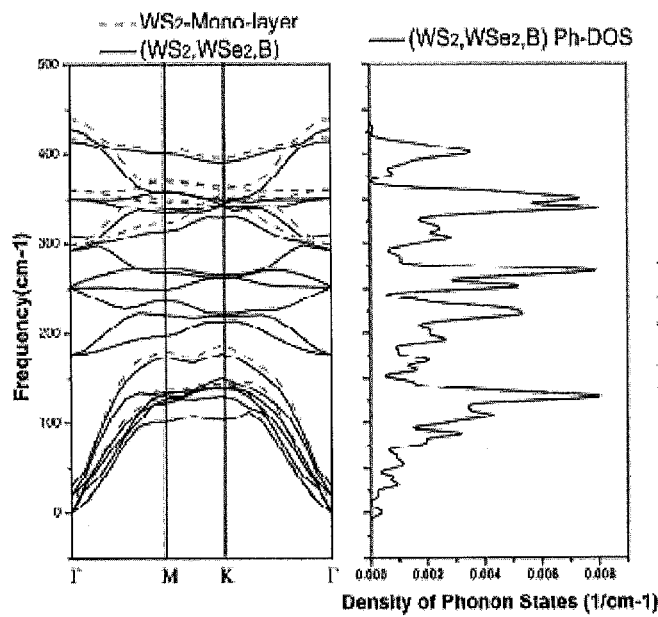

When mixing layers of $WS_2$ and $WSe_2$ a direct gap behavior at K is obtained for bilayer stackings A and B (see Table 1, FIG. 2D, FIG. 2F, and FIG. 3). Therefore, the direct gap is smaller than their corresponding indirect gaps at Γ-I. Although the direct gaps at K for this family are around 1 eV, the indirect gaps within Γ-I change from 0.883 eV for the crystal ($WS_2$,$WSe_2$,B) to 1.725 eV for the bilayer ($WS_2$, $WSe_2$,A) (see Table 1). The crystal formed by an infinite number of stacked layers in the A fashion, crystal ($WS_2$, $WSe_2$,A), exhibits a direct band gap at K, being this the first case of a multilayer STMD system with a direct band gap behavior (see FIG. 2F). Note that the direct band gaps for this family, around 1.0 eV (1239.84 nm), are reduced with respect to the direct band gaps for monolayers of $WS_2$ (1.94 eV or 639.09 nm), and $WSe_2$ (1.67 eV or 742.42 nm) (see Table 5), thus widening the possibilities of applications for STMD in the infrared range.

To analyze the nature of the direct band gap, we calculated the partial density of states (PDOS) considering the d-electrons of the transition metal and the p-electrons of the chalcogen atoms. The results indicate that the states at the top of the valence band, for the bilayer case (WS2-WSe2,A), are due to the W and Se of the $WSe_2$ layer, and those at bottom of the conduction band are owed to the W and S of the $WS_2$ layer. Therefore, electrons and holes are physically separated by the two different layers which constitute the TMD bilayer. A similar behavior has been found theoretically in h-BN nanotubes and homogeneous layered TMD when applying an external electric field; the so-called Giant Stark Effect (GSE). See Ramasubramaniam, A., Naveh, D. & Towe, E. Tunable band gaps in bilayer transition-metal dichalcogenides. *Phys. Rev. B* 84, (2011); and Khoo, K. H., Mazzoni, M. S. C. & Louie, S. G. Tuning the electronic properties of boron nitride nanotubes with transverse electric fields: A giant de Stark effect. *Phys. Rev. B* 69, (2004).

In GSE the electric field separates physically electrons and holes and also helps the reduction of the band gap. However, in the heterogeneous TMD bilayers there was no external electric field applied, but it has been found, for the direct band gap bilayers, that although there is charge neutrality in the whole system, the local Mulliken charges for the transition metal atoms, as well as for the chalcogen atoms, possess different sign in different layers. For example, for the bilayer (WS2-WSe2, A), the W of the $WS_2$ layer exhibits a positive net charge (+0.16 e), whereas the W of the $WSe_2$ layer reveals a negative net charge (−0.09 e). Similarly, the S atoms of the $WS_2$ layer exhibit a negative net charge, and the Se show a positive net charge. This is not the case for indirect band gap bilayers sharing the same chalcogen atom, as found in bilayer ($WS_2$,$MoS_2$,B) systems, in which both Mo and W atoms display the same charge sign as well as the S and Se atoms. Therefore, an intrinsic electric field might be the cause of the electron-hole separation and the presence of the direct band gap.

Since one of the most important experimental tools for characterizing few layer TMD systems is Raman spectroscopy, Hwang, W. S. et al. Transistors with chemically synthesized layered semiconductor $WS_2$ exhibiting $10^5$ room temperature modulation and ambipolar behavior. *Applied Physics Letters* 101, (2012); Wang, H. et al. Integrated Circuits Based on Bilayer $MoS_2$ Transistors. *Nano Letters* 12, 4674-4680, (2012); Splendiani, A. et al. Emerging Photoluminescence in Monolayer $MoS_2$. *Nano Letters* 10, 1271-1275, (2010); Eda, G. et al. Photoluminescence from Chemically Exfoliated $MoS_2$. *Nano Letters* 11, 5111-5116, (2011); Gutierrez, H. R., Perea-Lopez, N., Elias, A. L., Berkdemyr, A., Wang, B., L V, R., Lopez-Urias, F., Crespi, V. H., Terrones, H., Terrones, M. Extraordinary Room-Temperature Photoluminescence in Triangular $WS_2$ Monolayers. *Nano Letters* DOI 10.1021/nl3026357, (2012); and Li, H. et al. From Bulk to Monolayer MoS2: Evolution of Raman Scattering. *Advanced Functional Materials* 22, 1385-1390, (2012), the phonon dispersion, the phonon density of states and the Raman intensities have been calculated using density functional perturbation theory for the bilayer (WS2-WSe2,B) (see FIG. 3D and FIG. 3E). When compared to the $WS_2$ monolayer, the phonon dispersion of the bilayer exhibits a shift which might be caused by the expansion of the $WS_2$ lattice when interacting with the $WSe_2$ layer. From the phonon dispersion and the Raman intensities, it is possible to identify the main phonon modes and their positions: $E_{1g}$ (176.99 cm$^{-1}$ for $WSe_2$ and 293.23 for $WS_2$), $E_{2g}^1$ (251.33 cm$^{-1}$ for $WSe_2$ and 350.50 cm$^{-1}$ for $WS_2$) and $A_{1g}$ (251.80 cm$^{-1}$ for $WSe_2$ and 414.93 for $WS_2$. See FIG. 3E. Note that the $E_{2g}^1$ and the $A_{1g}$ for the $WSe_2$ are almost degenerate as has been found experimentally in bulk $WSe_2$ (250 cm$^{-1}$ for $E_{2g}^1$ and 253 cm$^{-1}$ for $A_{1g}$). See Mead, D. G.

& Irwin, J. C. Long wavelength optic phonons in WSe2. *Canadian Journal of Physics* 55, 379-382, (1977).

The crystal formed by alternating layers with the stacking type B, crystal ($WS_2$,$WSe_2$,B), always exhibits an indirect gap at Γ-I (see Table 1). The bilayer ($WS_2$,$WSe_2$,B) is more stable by 0.0758 eV/Cell when compared to the bilayer ($WS_2$,$WSe_2$,A). For the infinite crystal cases, crystal ($WS_2$, $WSe_2$,B) is more stable by 0.1494 eV/cell than crystal ($WS_2$,$WSe_2$,A) (see Table 2), and the lattice parameter of this family is ca. 3.20 Å (see Table 3).

TABLE 3

| Hybrid-Structure | Bilayer stacking A | Bilayer stacking B | Crystal stacking A | Crystal stacking B |
|---|---|---|---|---|
| $WS_2$_$MoS_2$ Type 1 | 3.155 (3.686) | 3.157 (3.439) | 3.156 (3.671) | 3.158 (3.441) |
| $WS_2$_$WSe_2$ Type 2 | 3.204 (3.763) | 3.205 (3.527) | 3.204 (3.763) | 3.206 (3.531) |
| $MoS_2$_$WSe_2$ Type 2 | 3.218 (3.765) | 3.219 (3.522) | 3.218 (3.734) | 3.220 (3.502) |
| $WS_2$_$MoSe_2$ Type 3 | 3.210 (3.768) | 3.211 (3.521) | 3.211 (3.769) | 3.213 (3.523) |
| $MoS_2$_$MoSe_2$ Type 3 | 3.225 (3.768) | 3.226 (3.497) | 3.226 (3.740) | 3.228 (3.499) |
| $WSe_2$_$MoSe_2$ Type 4 | 3.277 (3.833) | 3.278 (3.584) | 3.277 (3.844) | 3.280 (3.601) |

Lattice parameters "a" in Å, and distance dS—$S_e$ (in parenthesis) between chalcogen atoms in Å between the two layers of STMD The bond lengths W—S are around 2.413 Å, slightly larger than for the $WS_2$ monolayer. At the same time, a slight reduction in the W—Se distances is observed when compared to the monolayer from 2.519 Å to 2.510 Å (see Table 4 Bilayer systems of $MoS_2$—$WSe_2$, exhibit a direct gap with A and B stackings, as well as the infinite crystal with the A stacking (see FIG. 2E). However, the direct gap values for these cases are ca. 0.8 eV (1549.8 nm) (see Table 1). The indirect gap Γ-I varies from 0.736 eV for the crystal ($MoS_2$, $WSe_2$,B) to 1.525 eV for bilayer ($MoS_2$,$WSe_2$,A). With regard to the energetics, the crystal ($MoS_2$,$WSe_2$,B) is more stable than the crystal ($MoS_2$,$WSe_2$,A) by 0.1613 eV/Cell, and for the bilayer cases, the crystal stacking B is more stable than the A stacking by 0.0816 eV/cell (see Table 2). The lattice parameter "a" of this family ranges between 3.218 Å and 3.22 Å (see Table 3). Here, the Mo—S distance increases to 2.430 Å compared to the $MoS_2$ monolayer (2.417 Å), and the W—Se decreases slightly around 0.008 Å (see Table 4).

Family of Hybrids $WS_2$—$MoSe_2$ and $MoS_2$—$MoSe_2$ (Type 3)

The hybrid cases consisting of $WS_2$—$MoSe_2$ layers and $MoS_2$—$MoSe_2$ layers share similarities. First, both of them exhibit dominant direct band gaps when stacked in the A fashion (Bilayer and infinite layers. See Table 1. Both bilayer cases are indirect gap Γ-K materials when exhibiting staking type B. Note that for the previous cases, the indirect gap occurred at Γ-I (see Table 1). This hybrid system (type 3) could exhibit three electronic behaviors: Direct gap at K, indirect gap Γ-I and indirect gap Γ-K. This result enriches the possibilities of creating novel hetero-layered nanostructures exhibiting unprecedented physico-chemical properties. In addition, the direct band gap for the $WS_2$—$MoSe_2$ cases varies from 1.154 eV (1074.38 nm) for the bilayer ($WS_2$, $MoSe_2$,A) case to 1.180 eV (1050.71 nm) for the bilayer ($WS_2$,$MoSe_2$,B) which does not have a fundamental direct gap, but an indirect gap Γ-K (see Table 1). The indirect gap at Γ-K is 1.052 eV for the bilayer ($WS_2$,$MoSe_2$,B), and the indirect gap at Γ-I changes from 0.790 eV for the crystal ($WS_2$,$MoSe_2$,B) to 1.594 eV for the bilayer ($WS_2$,$MoSe_2$, A). The most stable cases correspond to the stacking type B, being more favorable by 0.1517 eV/cell the crystal ($WS_2$, $MoSe_2$,B) than the crystal ($WS_2$,$MoSe_2$,A). The bilayer ($WS_2$,$MoSe_2$,B) is more stable by 0.0768 eV/cell when compared to the bilayer ($WS_2$,$MoSe_2$,A) (see table 2). The lattice parameter "a" for this family is around 3.21 Å (see Table 3).

The situation for the $MoS_2$—$MoSe_2$ family is similar to the previous system described, but exhibiting a direct gap at ca. 0.945 eV (1312.00 nm). The indirect gap Γ-I changes from 0.699 eV for crystal ($MoS_2$,$MoSe_2$,B) to 1.560 eV for bilayer ($MoS_2$,$MoSe_2$,A) (See Table 1). The crystal ($MoS_2$, $MoSe_2$,B) is more stable by 0.1645 eV/cell than crystal ($MoS_2$,$MoSe_2$,A). The bilayer ($MoS_2$,$MoSe_2$,A) is less stable than bilayer ($MoS_2$,$MoSe_2$,B) by 0.0834 eV/cell (see Table 2). The lattice parameter "a" is 3.225 Å for the bilayer($MoS_2$,$MoSe_2$,A), with little change for the crystal ($MoS_2$,$MoSe_2$,B), being 3.228 Å (see Table 3). For the type 3 family, the metal-sulfur distances increase and the metal-selenium distances decrease with respect to their corresponding monolayers (see Table 4).

Family of Hybrids $WSe_2$—$MoSe_2$ (Type 4)

For the cases studied using overlapped layers of $WSe_2$ and $MoSe_2$, there is no direct band gap smaller than the indirect gaps at Γ-I and K-I, condition that needs to be satisfied in order to have a fundamental direct band gap material. For bilayer ($WSe_2$,$MoSe_2$,A), the direct gap at the K point is smaller (1.443 eV) than the indirect gap Γ-I (1.538 eV), but not smaller than the indirect gap at K-I (1.330 eV). Thus, the material possesses an indirect gap at K-I (see Table 1). The PDOS of bilayer ($WSe_2$,$MoSe_2$,A) shows that the states at the top of the valence band are slightly dominated by the $WSe_2$ layer (W d-electrons, and Se p-electrons); however, the bottom of the conduction band exhibits states from both layers, with more states arising from the $MoSe_2$ layer.

The crystal ($WSe_2$,$MoSe_2$,A) also exhibits a K-I band gap of 1.215 eV (see Table 1). The other two cases: bilayer (WSe2,MoSe2,B) and crystal (WSe2,MoSe2,B), reveal indirect band gaps Γ-I (see Table 1). The relative stability of the crystalline cases indicates that the crystal ($WSe_2$,$MoSe_2$, B) is more stable than crystal ($WSe_2$,$MoSe_2$,A) by 0.1632 eV/Cell. For bilayers, the bilayer (Wse2,MoSe2,B) is more stable by 0.0826 eV/cell than bilayer ($WSe_2$,$MoSe_2$,A) (see Table 2). The lattice parameter "a" of this family is the largest of all studied STMD with 3.28 Å for the crystal ($WSe_2$,$MoSe_2$,B). This cell parameter is very close to that reported experimentally for $WSe_2$ and $MoSe_2$ crystals, Bonneau, P. R., Jarvis, R. F. & Kaner, R. B. Rapid solid-state synthesis of materials from molybdenum-disulfide to refractories. *Nature* 349, 510-512, (1991), James, P. B. & Lavik, M. T. Crystal structure of MoSe2. *Acta Crystallographica* 16, 1183-&, (1963), (see tables 3 and 5). The bond distance of W—Se exhibits a slight increase (2.521 Å) when compared to the corresponding distance of the monolayer (2.519 Å). The distance Mo—Se is basically preserved when compared to the monolayer (see Table 4).

Part of our appreciation of the novel properties afforded by our novel materials afforded herein arises from our development of a novel method for preparation of these materials. We provide a controlled thermal reduction-sulfurization method to synthesize large area (~1 cm$^2$) WS$_2$ sheets with thicknesses ranging from monolayers to few layers. During synthesis, WO$_x$ thin films are first deposited on Si/SiO$_2$ substrates, which are then sulfurized (under vacuum) at high temperatures (750-950° C.). An efficient route to transfer the synthesized WS$_2$ films onto different substrates such as quartz and transmission electron microscopy (TEM) grids has been satisfactorily developed using concentrated HF. Samples with different thicknesses have been analyzed by Raman spectroscopy, TEM, atomic force microscopy (AFM), and their photoluminescence properties have been evaluated.

We demonstrate the presence of single-, bi- and few-layered WS$_2$ on as-grown samples. The electronic structure of these materials is very sensitive to the number of layers, ranging from indirect band-gap semiconductor in bulk phase to direct band-gap semiconductor for monolayers. This method has also proved successful in the synthesis of heterogeneous systems of MoS$_2$ and WS$_2$, thus shedding light in the control production of hetero-layered devices out of transition metal chalcogenides.

We are able to accomplish a controlled synthesis of large area (~cm$^2$) single-, bi- and few-layer WS$_2$ using a two step process. This is shown, for example, in FIGS. 5A and 5B. In one embodiment of this process, WO$_x$ thin films are deposited on a Si/SiO$_2$ substrate. These films are then sulfurized under vacuum in a second step occurring at high temperatures (750-950° C.). These WS$_2$ films may then be transferred onto different substrates, such as quartz and TEM grids, using concentrated HF. This is shown, for example in FIGS. 6A-6B.

We produced WS$_2$ films using a thermal reduction-sulfurization method achieving large area sheets and controllable thicknesses ranging from one to several layers. The WS$_2$ sheets were characterized by optical microscopy, Raman spectroscopy, AFM, HRTEM and optical spectroscopy. From HRTEM characterization and further analysis by fast Fourier transform (FFT), we determined the different WS$_2$ thicknesses.

It is important to mention that in some cases, during the transfer process, WS$_2$ films were folded or wrinkled exhibiting some regions with different WS$_2$ thicknesses and stacking. Bilayer and trilayer WS$_2$ with different layer stackings were witnessed by the formation of Moire patterns and were confirmed by FFT. WS$_2$ samples were targeted with a 488 nm excitation wavelength in order to analyze photoluminescence spectra, observing that only single layer WS$_2$ revealed a PL signal located around 2.0 eV. Investigations related to applications of monolayer WS$_2$-based photosensor devices and gas sensing are currently underway. This thermal sulfurization method of synthesizing large area WS$_2$ could now be implemented for the synthesis of other dichalcogenides materials such as MoS$_2$, MoSe$_2$, WSe$_2$, NbS$_2$, NbSe$_2$, etc. For instance, the method has been used to successfully produce few layered hybrid W$_x$Mo$_y$S$_2$ materials, as confirmed by Raman spectroscopy.

Si wafers with a thermally deposited SiO$_2$ layer of 285 nm were cleaned with acetone-isopropanol mixtures in an ultrasonic bath for 15 min. After drying with compress UHP N$_2$ gas, the wafers were loaded in the chamber of a physical vapor deposition equipment, PVD75 Kurt J. Lesker. WO$_3$ was thermally evaporated and deposited on the wafers; various thicknesses ranging from 2 nm to 18 nm were deposited at low pressures ($10^{-5}$-$10^{-6}$ Torr). For the hybrid W$_x$Mo$_y$S$_2$, MoO$_3$ was thermally evaporated on a WO$_x$ coated substrate. Si wafers were subsequently loaded into a quartz reaction tube for thermal treatment under a sulfur environment, as shown in FIGS. 1A-1D. 500 mg of S powder (95%, Alfa Aesar, CAS 7704-34-9) were placed in a boat outside the furnace; this zone was wrapped with a heating belt, which was heated at a temperature of 250° C. The pressure in the chamber was reduced to 35 mT for 10 min and 50 sccm of UHP Ar were flown afterwards, reaching a pressure of 450 mT. The split furnace was then heated at temperatures ranging from 750 to 900° C. Typical temperature ramps for both furnace and heating belt are shown in FIG. 5B.

A chemical method developed for the transfer of "as grown" WS$_2$ films is shown in FIG. 6A. WS$_2$ films were covered with a thin layer of poly(methyl methacrylate) by spin coating at 4000 rpm for 60 sec (MW 495,000, A3). After a 2 h polymer curing step, samples were immersed in hydrofluoric acid (ACS, 48-51%, Alfa Aesar, CAS 7664-39-3) for a few seconds to lift off the PMMA-WS$_2$ material. The films were then fished out with Mo foil and immersed in deionized water. Finally, the films were fished out with the desired substrate (quartz, TEM grids, etc) and allowed to dry under ambient conditions. To remove the PMMA coating, the samples were washed with acetone and isopropanol.

Although the method described herein is set forth in the context of production of WS2 films, those of skill in the art will recognize, with the benefit of this disclosure, that the method may be used to prepare significant numbers layered materials. This may be accomplished, for example, by depositing seed crystals on a cleaned silicon dioxide wafer. The wafer, including the crystals, is passed at high temperature through sulfur vapor in a chemical vapor deposition process. This might be useful for other sulfur calcochenides. In still further embodiments the vapor deposition is conducted using selenium.

To confirm that WS$_2$ had been prepared, we conducted Raman spectroscopy of both as grown and transferred WS$_2$ films in a Renishaw inVia confocal microscope-based Raman spectrometer using the 488 and 514.5 nm laser excitations. The 520 cm$^{-1}$ phonon mode from the Si substrate was used for calibration. WS$_2$ spectra were obtained for all samples, matching previous Raman studies.

Figures 8A, 8B:
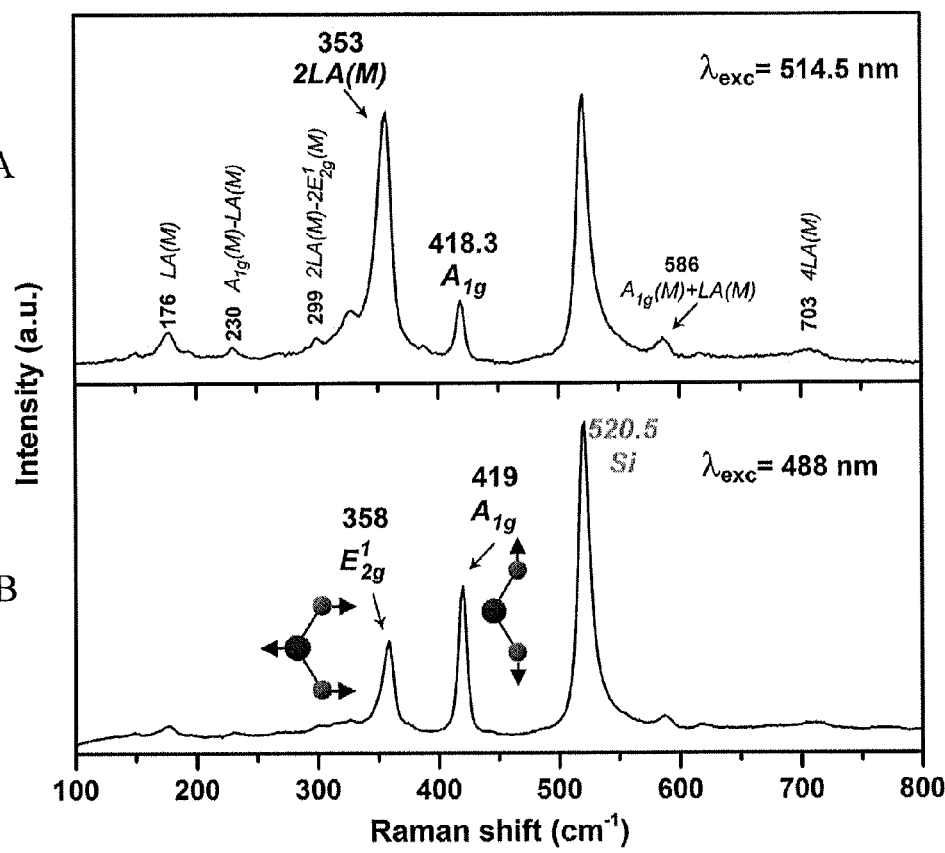
FIG. 8A and FIG. 8B show Raman characterization of monolayer WS$_2$ films with different excitation wavelengths.

For thicker WS$_2$ films, the $E^1_{2g}$ and $A_{1g}$ modes were easily identified. A single layered WS$_2$ spectrum was obtained for samples synthesized with the thinnest WO$_x$ film prepared (2 nm), as shown in FIG. 3. When using a 514 nm laser, the $A_{1g}$ (c.a. 418.5 cm$^1$) mode was identified, although the $E^1_{2g}$ (c.a. 356 cm$^1$) mode was screened by the presence of the 2LA(M) mode, located at 352-353 cm$^{-1}$. According to theoretical calculations, a double resonance Raman process occurs for single layered WS$_2$ that causes the 2LA(M) to emerge with intensities much larger (double) than those of the well-known $A_{1g}$ mode, as shown in FIG. 8A When using a 488 nm laser excitation wavelength, we identified the $A_{1g}$ mode at ca, 419 cm$^{-1}$ (see FIG. 8B). The double resonance process does not occur when using 488 nm, therefore, the 2LA(M) mode does not appear in FIG. 8B. The $E^1_{2g}$ mode was identified at around 357 cm$^{-1}$ for a 488 nm excitation wavelength. Raman spectra were acquired from samples in their original substrate and also after transfer onto Si/SiO$_2$ substrates, showing no variations.

HRTEM characterization was performed on WS$_2$ samples transferred onto quantifoil© gold TEM grids with 2µ gold TEM. In particular, we used a JEOL JEM-2100F equipped with double Cs-correctors, operated at 120 kV and 80 kV.

Gatan Digital Micrograph was used to acquire images, perform FFT, IFFT and other processes shown in this work. FIG. 9A exhibits the WS$_2$ hexagonal lattice. During the transfer process, WS$_2$ films could be folded or wrinkled. Due to this fact, we found some regions with different WS$_2$ thickness and stacking. FIG. 9B and FIG. 9C exhibit a bilayer and trilayer WS$_2$ with different stacking order, indicated by the formed Moire patterns and confirmed by the fast Fourier transform (see insets). FIG. 9D depicts the edge of a single layered WS$_2$ film.

WS$_2$ samples were shined with a 488 nm excitation wavelength in order to observe photoluminescence (PL; FIG. 5A). Recently, PL has been experimentally found in single layered WS$_2$ and MoS$_2$, and our monolayer WS$_2$ films exhibit strong PL signals. The bulk phase of WS$_2$ possess an indirect electronic band gap of around 1.4 eV and a direct band gap of 2.01 eV, whereas, single layered WS$_2$ exhibits a direct band gap at ca. 1.9 eV, in close agreement with DFT-LDA calculations (see FIG. 10B).

FIG. 10C and FIG. 10D display the calculated electronic band structure for both monolayer and bulk WS$_2$. Therefore, a PL signal located at around 1.9 eV indicates the presence of single layered WS$_2$. Experimental PL spectra are shown in FIG. 10A, where single layered WS$_2$ shows a PL signal centered at around 2.02 eV (613 nm). PL maps of 60×60 µm regions were carried out, to show the uniformity of the single layered samples. A very weak PL signal was found for double layered WS$_2$ samples at around 1.93 eV (642 nm), with a shoulder located at 2.17 eV (571 nm). For tri layered samples, an extremely weak PL signal was found at 1.92 ev (647 nm) and a weaker signal was found at 2.18 eV (570 nm). Interestingly, for WS$_2$ single layered triangular islands, the PL signal was found at slightly lower energies, such as 1.95 eV To investigate the origin of this shift, we performed theoretical calculations using the plane wave code CASTEP functional with 10×10×3 Monkhorst-Pack K-points and a plane waves cut off of 500 eV, with a norm-conserving pseudopotential. The structures were relaxed until the forces became smaller to 0.01 eV/Å and the energy tolerances were less to 5×10$^{-6}$ eV/atom. A vacuum of 16 Å between the layers was considered.

FIG. 10B depicts our theoretical results, in which a relaxed WS$_2$ sheet would have a decreasing gap when the lattice is expanded. Particularly, a 0.3% strain or expansion would result in a variation of 50 meV in the electronic band gap. Our results are in agreement with those reported by other groups within the LDA formalism [Ding Y, et al Physica B—Condensed Matter 2011; Mahatha, et al. Journal of Physics—Condensed Matter 2012]. In particular, the decreasing gap behavior due to the expansion of the lattice, agrees with calculated data for MoS$_2$ [Yue et al. Phys Lett A 2012]. The strain has been introduced by compressing or expanding the cell parameters at steps of 0.2% of the non-strained parameters (a=b=3.146 Å). Therefore, we might conclude that there is strain present in the triangular islands of WS$_2$.

The described synthesis method is very versatile. Good quality few layered WS$_2$ and MoS$_2$ have also been obtained following this method, but at atmospheric pressure. For these experiments, an Ar flow of 100 sccm was used, while the rest of the set up remains as described in FIG. 5. Interestingly, hybrid systems (MoS$_2$—WS$_2$) can also be achieved by adding an extra layer of MoO$_x$ on the Si/SiO$_2$/WO$_x$ substrates. For a 2 nm WO$_x$ and 2 nm MoO$_x$, a few layer hybrid material, so called W$_x$Mo$_y$S$_2$, has been identified by Raman spectroscopy (see FIG. 7).

Figure 7:
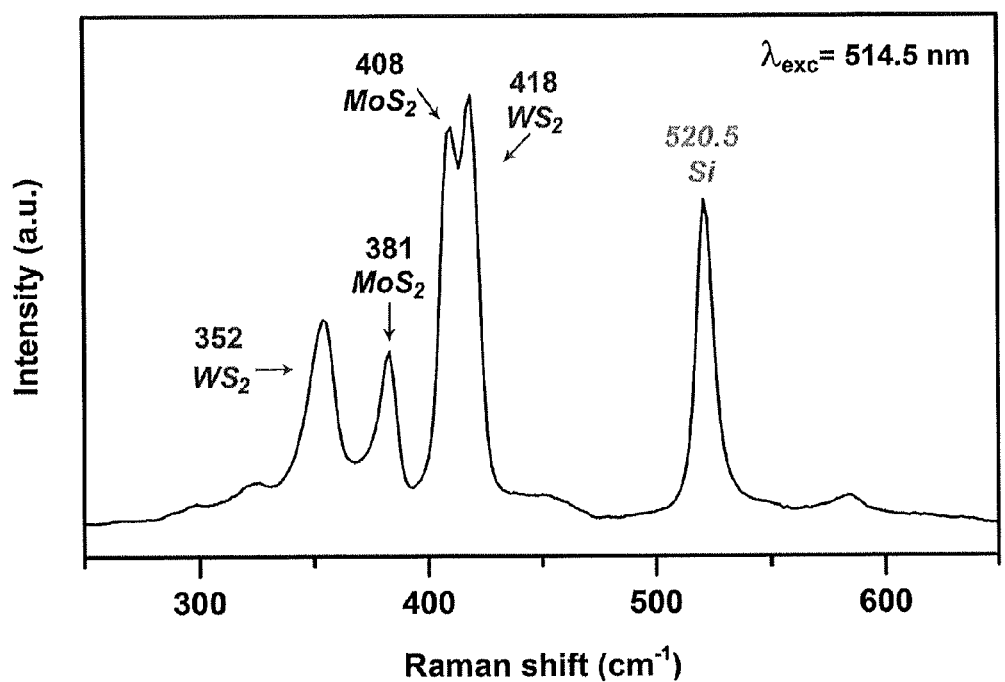
FIG. 7 shows the Raman spectrum of a hybrid W$_x$Mo$_y$S$_2$ layer grown directly on Si/SiO$_2$ at atmospheric pressure. The spectrum was acquired with a 514 nm laser excitation wavelength.

The spectrum exhibits the strongest bands corresponding to both MoS$_2$ and WS$_2$ (E12g and A1g). In FIG. 7, those bands are highlighted in red for WS$_2$ (352.2 and 418 cm$^{-1}$) and in blue for MoS$_2$ (381 and 408.3 cm$^{-1}$). Hybrid M$_{1-x}$W$_x$S$_2$ single layers have been recently reported [Nat Comm 2013]. Crystals with such chemical composition were synthesized by chemical vapor transport at a 1000° C. and were subsequently mechanically exfoliated [Nat Comm 2013]. W and Mo were visualized by scanning transmission electron microscopy. For the case of our synthesized W$_x$Mo$_y$S$_2$, Raman spectroscopy suggests that both WS2 and MoS2 coexist in the same material. Two possibilities are envisaged: First, having an heterogeneous bilayer (multilayer) system of MoS$_2$ and WS$_2$, or possessing a multilayer system with a mixture of domains of MoS$_2$ and WS$_2$ blended in each layer. In both cases, our method sheds light on the production of heterogeneous transition metal chalcogenide structures.

While we have shown and described certain present preferred embodiments of our heterostructures made of bilayer and multilayer TMDs, and have illustrated certain present preferred methods of making and using the same, it is to be distinctly understood that the invention is not limited thereto but may be otherwise variously embodied and practiced by those skilled in the art with the benefit of the disclosure made herein.

Patents, patent applications, publications, scientific articles, books, web sites, and other documents and materials referenced or mentioned herein are indicative of the levels of skill of those skilled in the art to which the inventions pertain, as of the date each publication was written, and all are incorporated by reference as if fully rewritten herein. Inclusion of a document in this specification is not an admission that the document represents prior invention or is prior art for any purpose.

What is claimed is:

1. A layered semiconducting material comprising heterobilayers, said heterobilayers including semiconducting direct band gaps comprising transition metal dichalcogenides (TMD), wherein a heterobilayer comprises a first monolayer including a first TMD and a second monolayer including a second TMD, wherein the first TMD has a different transition metal or a different chalcogenide than the second TMD, wherein at least one of said heterobilayers is a hybrid semiconducting transition metal dichalcogenide (STMD) selected from the group consisting of WS$_2$—MoS$_2$, WSe$_2$—WS$_2$, WSe$_2$—MoS$_2$, MoSe$_2$—WS$_2$, MoSe$_2$—MoS$_2$, and WSe$_2$—MoSe$_2$.

2. The layered semiconducting material of claim 1, wherein said material comprises direct band gaps and indirect band gaps that are smaller than those in a monolayer system comprising TMD.

3. The material of claim 1, wherein said heterobilayers comprise at least one of a bilayer and a multilayer of more than one TMD.

4. The material of claim 1, wherein said material exhibits valley polarization due to lack of inversion symmetry.

5. The layered semiconducting material of claim 1, wherein at least one of said heterobilayers is a hybrid semiconducting transition metal dichalcogenides (STMD) selected from the group consisting of WSe$_2$WS$_2$, WSe$_2$—MoS$_2$, MoSe$_2$—WS$_2$, MoSe$_2$—MoS$_2$, and WSe$_2$—MoSe$_2$.

6. A TMD system comprising at least two layers selected from the group consisting of
   MX$_2$, where M is selected from the group consisting of Mo, W, and Nb, and where X is selected from the group consisting of S, Se, and Te, and wherein a pair of the at least two layers of the TMD system form a heterobilayer, wherein a first layer of the heterobilayer has a different M or a different X than a second layer of the heterobilayer wherein at least one layer of said at least two layers is $NbS_2$.

7. The TMD system of claim 6, comprising a gap, wherein the gap is direct and ranges from 0.79 eV to 1.16 eV.

8. Contacts for a two dimensional electronic device, wherein said contacts comprise a TMD system of claim 6.

* * * * *